(12) United States Patent
Suzuki et al.

(10) Patent No.: US 12,342,468 B2
(45) Date of Patent: Jun. 24, 2025

(54) INSPECTION DEVICE AND INSPECTION METHOD FOR DETECTING FORMATION OF A SOLDER BRIDGE OVER ADJACENT ELECTRODES

(71) Applicant: FUJI CORPORATION, Chiryu (JP)

(72) Inventors: Mikiya Suzuki, Nishio (JP); Yuta Yokoi, Kariya (JP)

(73) Assignee: FUJI CORPORATION, Chiryu (JP)

( * ) Notice: Subject to any disclaimer, the term of this patent is extended or adjusted under 35 U.S.C. 154(b) by 349 days.

(21) Appl. No.: 17/758,663

(22) PCT Filed: Jan. 17, 2020

(86) PCT No.: PCT/JP2020/001559
§ 371 (c)(1),
(2) Date: Jul. 12, 2022

(87) PCT Pub. No.: WO2021/144981
PCT Pub. Date: Jul. 22, 2021

(65) Prior Publication Data
US 2023/0029470 A1    Feb. 2, 2023

(51) Int. Cl.
*H05K 13/08*    (2006.01)
*G01M 1/12*     (2006.01)
(Continued)

(52) U.S. Cl.
CPC ........ *H05K 13/0817* (2018.08); *G01M 1/122* (2013.01); *G06T 7/001* (2013.01);
(Continued)

(58) Field of Classification Search
CPC .. H05K 13/0817; H05K 1/0269; H05K 3/341; H05K 3/12; H05K 2203/162;
(Continued)

(56) References Cited

U.S. PATENT DOCUMENTS 2,964,007 A * 12/1960 Buffington ........... B23K 3/0669
                                                    118/421
4,362,987 A * 12/1982 Clinton ................. G01R 31/08
                                                    324/525
(Continued)

FOREIGN PATENT DOCUMENTS

JP    2002-543421 A      12/2002
JP    2003315014 A  * 11/2003  ............. G01B 11/02
(Continued)

OTHER PUBLICATIONS

International Search Report mailed on Mar. 24, 2020, PCT/JP2020/001559 filed on Jan. 17, 2020 (3 pages).

*Primary Examiner* — Michael P LaPage
(74) *Attorney, Agent, or Firm* — Oblon, McClelland, Maier & Neustadt, L.L.P.

(57) ABSTRACT

The present disclosure provides an inspection device for use in a mounting system including a mounting device for disposing a component on a board, including a control section configured to extract a mass area included in a captured image resulting from imaging a processing target object where a viscous fluid is formed at a predetermined part, obtain a center of gravity of the mass area so extracted, and determine whether the center of gravity is included in a normal range of the predetermined part as a reference of the captured image to thereby determine whether a bridge has occurred where the viscous fluid is formed over adjacent predetermined parts.

3 Claims, 7 Drawing Sheets

(51) Int. Cl.
  *G06T 7/00* (2017.01)
  *G06T 7/66* (2017.01)
  *G01N 21/88* (2006.01)
  *G01N 21/956* (2006.01)

(52) U.S. Cl.
  CPC ........ *G06T 7/66* (2017.01); *G01N 2021/8887* (2013.01); *G01N 2021/95638* (2013.01); *G01N 2021/95646* (2013.01); *G06T 2207/30141* (2013.01); *G06T 2207/30152* (2013.01)

(58) Field of Classification Search
  CPC .......... G01M 1/122; G06T 7/001; G06T 7/66; G06T 2207/30141; G06T 2207/30152; G06T 7/0004; G01N 2021/8887; G01N 21/8851; G01N 2021/95638; G01N 2021/95646; G01N 21/956
  See application file for complete search history.

(56) References Cited

U.S. PATENT DOCUMENTS

| | | | |
|---|---|---|---|
| 5,086,397 A * | 2/1992 | Schuster | G07C 3/14 700/110 |
| 5,592,562 A * | 1/1997 | Rooks | G01N 23/046 29/830 |
| 6,738,505 B1 | 5/2004 | Prince | |
| 9,791,383 B2 * | 10/2017 | Gaukroger | H05K 3/1216 |
| 10,674,651 B2 * | 6/2020 | Kim | G01N 21/956 |
| 2004/0175030 A1 | 9/2004 | Prince | |
| 2004/0218808 A1 | 11/2004 | Prince | |
| 2005/0169514 A1 | 8/2005 | Prince | |
| 2005/0209822 A1 * | 9/2005 | Ishiba | H05K 13/0817 702/185 |
| 2006/0245637 A1 | 11/2006 | Prince | |
| 2006/0257015 A1 * | 11/2006 | Katahata | G06T 7/001 382/145 |
| 2012/0294508 A1 * | 11/2012 | Wada | G06T 7/0008 382/150 |
| 2015/0138742 A1 * | 5/2015 | Nguyen | H05K 1/111 361/767 |
| 2015/0289426 A1 * | 10/2015 | Mantani | H05K 13/0015 228/9 |
| 2019/0029152 A1 * | 1/2019 | Shibata | G01N 21/95607 |
| 2019/0364707 A1 * | 11/2019 | Futamura | G06T 7/0006 |

FOREIGN PATENT DOCUMENTS

| | | |
|---|---|---|
| JP | 2004-50413 A | 2/2004 |
| JP | 2005-164455 A | 6/2005 |

\* cited by examiner

E

L

INSPECTION DEVICE AND INSPECTION METHOD FOR DETECTING FORMATION OF A SOLDER BRIDGE OVER ADJACENT ELECTRODES

TECHNICAL FIELD

The present description discloses an inspection device and an inspection method.

BACKGROUND ART

Conventionally, there has been proposed, as an inspection device, a solder inspection device for inspecting a print state of solder printed on a land of a board, in which in the case that a portion having a light reflective characteristic similar to that of solder such as an end portion of a board exists on the circumference of a solder printing portion, which constitutes an inspection target, thereby resulting in a risk of the relevant portion being erroneously recognized as solder or in the case that there is caused a problem in that solder for connecting multiple solder printing portions existing on a single land is determined to be a "bridge", it is proposed to set a range that causes these erroneous recognition and problem as a mask area that departs from an image processing execution target for inspection (refer to Patent Literature 1, for example). In this mounting device, image processing is executed on image data excluding the mask area, which is the image processing execution target, so as to eliminate an erroneous determination in an inspection which would be caused by noise or a solder print shape in an image, thereby making it possible to obtain a stable and correct inspection result. In addition, as a printing device, there has been proposed a printing device in which a defective portion and a defective manner of a circuit pattern is recognized from an image of a printed board and a solder paste remaining portion in an opening portion of a corresponding screen mask is specified based on the detective portion and the defective manner, whereby the remaining solder paste is removed by jetting air to the solder paste remaining portion with a jet nozzle (refer to Patent Literature 2, for example). With this device, it is understood that the solder paste remaining in the opening portion can be efficiently removed.

PATENT LITERATURE

Patent Literature 1: JP-A-2005-164455
Patent Literature 2: JP-A-2004-50413

BRIEF SUMMARY

Technical Problem

However, in the device of Patent Literature 1 described above, since the mask area cannot be set in the case that the position where to dispose the board is not determined, the device is not good enough to execute a bridge detection. In the device of Patent Literature 2, although the solder paste is designed to be detected, no consideration is taken for a bridge detection. That is, an inspection device is demanded which can execute an appropriate bridge detection.

The present disclosure has been made in view of these problems described above, and a main object thereof is to provide an inspection device and an inspection method for executing more appropriately a detection of a bridge where a viscous fluid is formed over a predetermined part.

Solution to Problem

To achieve the main object described above, an inspection device and an inspection method which are disclosed in the present description adopt the following means.

According to the present disclosure, there is provided an inspection device for use in a mounting system including a mounting device for disposing a component on a board, including:

a control section configured to extract a mass area included in a captured image resulting from imaging a processing target object where a viscous fluid is formed at a predetermined part, obtain a center of gravity of the mass area so extracted, and determine whether the center of gravity is included in a normal range of the predetermined part as a reference of the captured image to thereby determine whether a bridge has occurred where the viscous fluid is formed over adjacent predetermined parts.

With this inspection device, the mass area included in the captured image resulting from imaging the processing target object where the viscous fluid is formed at the predetermined part is extracted, the center of gravity of the mass area so extracted is obtained, and whether the center of gravity of the mass area is included in the normal range of the predetermined part as the reference of the captured image, whereby whether the bridge has occurred is determined. In detecting the area where the viscous fluid is formed, for example, in the case that a bridge has occurred over multiple predetermined parts, the area is extracted as a mass, and therefore, a normal range of a predetermined part including no center of gravity has occurred. With this inspection device, a bridge detection can be executed more appropriately by determining whether there exists a normal range of a predetermined part including no center of gravity.

DESCRIPTION OF EMBODIMENTS

Figure 1:
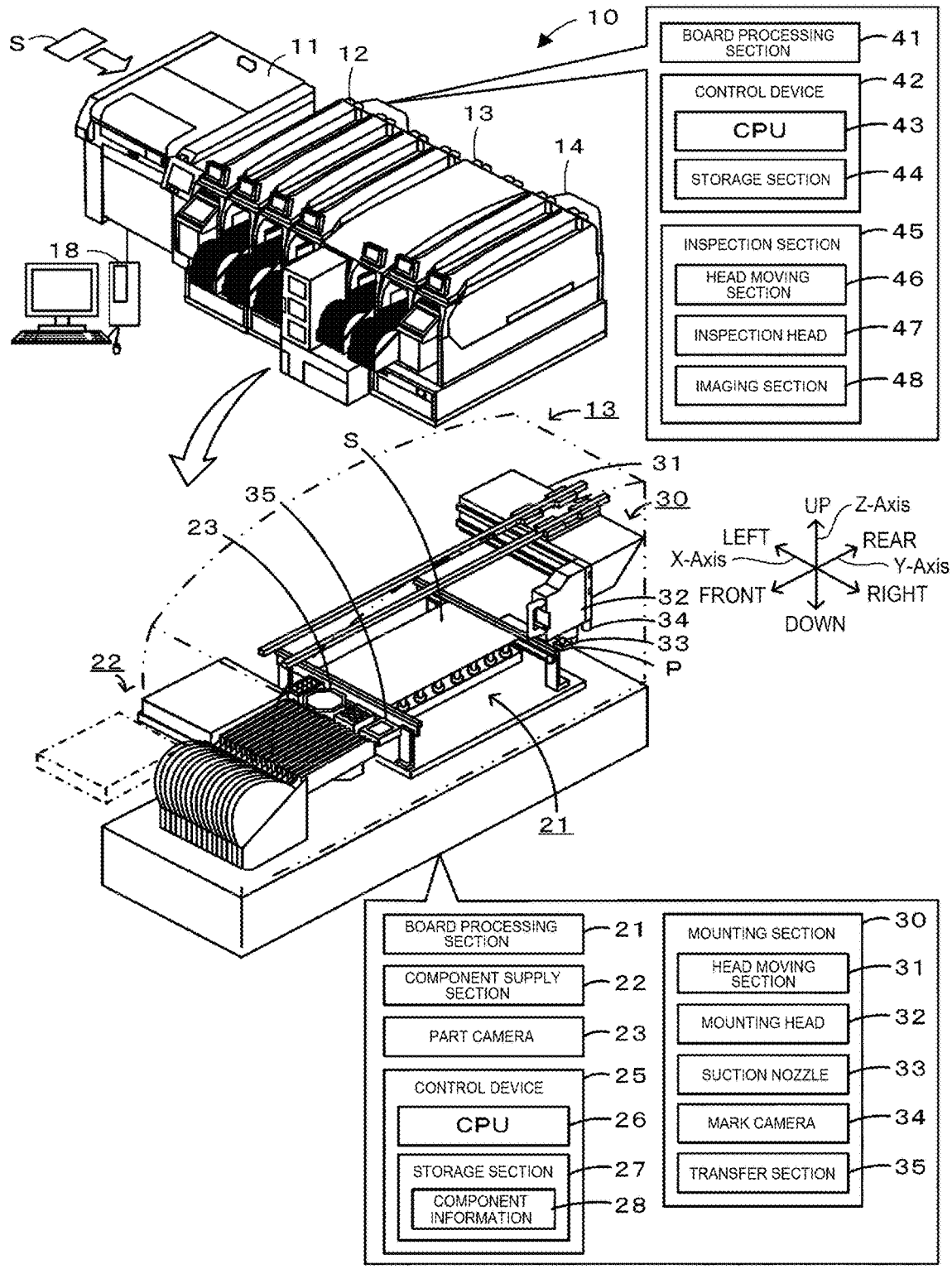
FIG. 1 is a schematic explanatory diagram showing an example of mounting system 10 and mounting device 13.
Figure 2A:
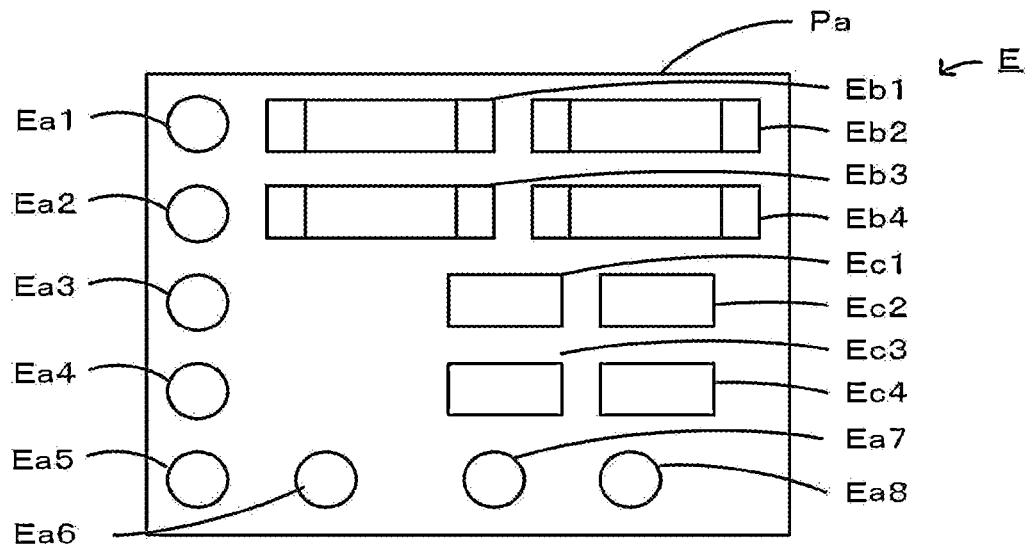
FIG. 2 shows explanatory diagrams showing examples of components Pa which are to be picked up by mounting head 32.
Figure 2B:
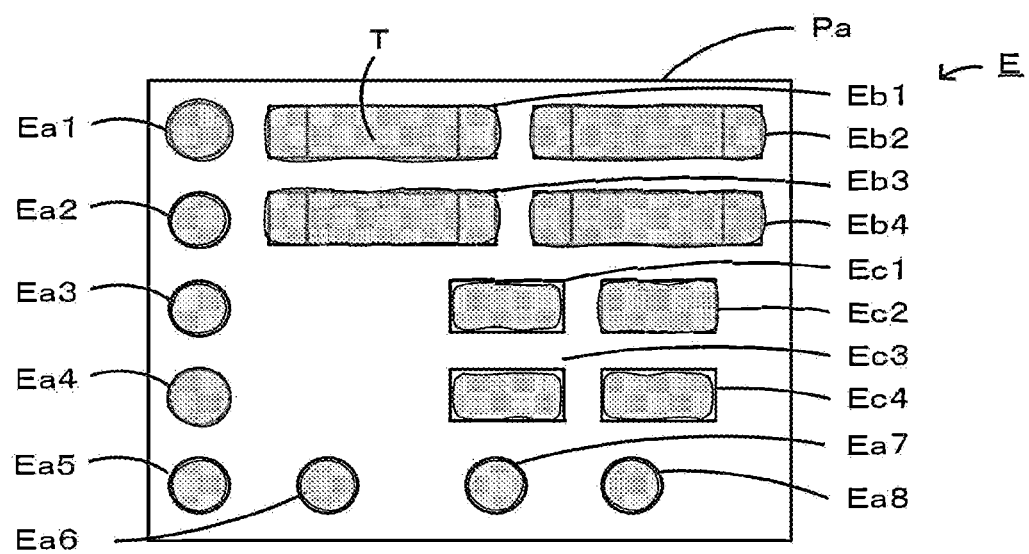

Hereinafter, referring to drawings, an embodiment of the present description will be described. FIG. 1 is a schematic explanatory diagram showing an example of mounting system 10 and mounting device 13. FIG. 2 shows explanatory diagrams showing examples of components Pa which are to be picked up by mounting head 32, and FIG. 2A is an explanatory diagram showing components Pa onto which solder B has not yet been transferred, while FIG. 2B is an explanatory diagram showing components Pa onto which solder B has been transferred. Mounting system 10 is a system for executing a mounting process relating, for example, to a process for mounting component P on board S. In the present embodiment, a left-right direction (an X axis), a front-rear direction (a Y axis), and an up-down direction (a Z axis) are taken as illustrated in FIG. 1.

Mounting system 10 is configured as, for example, a production line in which mounting device 13 for mounting components P on board S, which is a mounting target object, is aligned in a conveyance direction of board S. Here, although board S is described as the mounting target object, the mounting target object is not particularly limited thereto as long as component P can be mounted thereon, and hence, a three-dimensionally shaped base material may be adopted As shown in FIG. 1, mounting system 10 includes printing device 11, print inspection device 12, mounting device 13, mounting inspection device 14, and management PC 18. Printing device 11 is a device for printing a solder paste, which is a viscous fluid, or the like on board S. Print inspection device 12 is a device for inspecting a state of the printed solder. Mounting device 13 is a device for mounting component P on board S. Mounting inspection device 14 is a device for inspecting a state of component P mounted by mounting device 13.

Print inspection device 12 includes board processing section 41, control device 42, and inspection section 45. Board processing section 41 is a unit similar to board processing section 21 of mounting device 13. Control device 42 has a configuration similar to that of control device 25 and includes CPU 43 and storage section 44. Inspection section 45 is a unit for inspecting a state of board S itself or a solder paste printed on board S, and includes head moving section 46, inspection head 47, and imaging section 48. Head moving section 46 is a unit for moving inspection head 47 in XY directions as head moving section 31 does. Inspection head 47 is provided on imaging section 48 for imaging board S from above and is moved in the XY directions by head moving section 46. Print inspection device 12 performs an inspection for whether a shape of a printed solder paste is normal or whether a solder paste is printed in an appropriate position by use of reference information including information on a reference position where the solder paste is to be printed and the shape of the printed solder paste.

As shown in FIG. 1, mounting device 13 includes board processing section 21, component supply section 22, part camera 23, control device 25, and mounting section 30. In addition to its function of executing the mounting process for disposing component P on board S, mounting device 13 also includes a function of executing an inspection process for inspecting component P and board S. Board processing section 21 is a unit for loading, conveying, fixing in a mounting position, and unloading board S. Board processing section 21 has a pair of conveyor belts that are provided spaced apart in the front-rear direction while being stretched in the left-right direction as seen in FIG. 1. Board S is conveyed by this pair of conveyor belts.

Component supply section 22 has multiple feeders, each including a reel, and tray units, and is detachably attached to a front side of mounting device 13. A tape is wound around each reel, and multiple components P are held on a surface of the tape along a longitudinal direction of the tape. This tape is unwound from the corresponding reel towards the rear, and is fed with components P exposed by a feeder section to a pickup position where components P are picked up by suction nozzle 33. The tray unit has a tray on which multiple components P are placed while being aligned and brings this tray out to and in from a predetermined pickup position.

Part camera 23 is an imaging section for capturing an image and a unit for imaging one or more components P which are picked up by and held to mounting head 32. Part camera 23 is disposed between component supply section 22 and board processing section 21. An imaging range of part camera 23 resides above this part camera 23. When mounting head 32 holding component P passes over part camera 23, part camera 23 captures an image of that component P and outputs captured image data to control device 25.

Mounting section 30 is a unit for picking up component P from component supply section 22 to dispose component P so picked up onto board S which is fixed to board processing section 21. Mounting section 30 includes head moving section 31, mounting head 32, suction nozzle 33, mark camera 34, and transfer section 35. Head moving section 31 includes a slider configured to move in the XY directions while being guided by a guide rail, and a motor for driving the slider. Mounting head 32 is detachably mounted on the slider, and is configured to be moved in the XY directions by head moving section 31. Mounting head 32 has one or more suction nozzles 33 (for example, 4, 8, or 16 suction nozzles) which are detachably mounted on a lower surface side thereof, so that multiple components P can be picked up at one time. Suction nozzle 33 is a pickup member for picking up a component by making use of a negative pressure. The pickup member may be a mechanical chuck for gripping on component P. Mark camera 34 is provided on the lower surface side of mounting head 32 (or the slider). Mark camera 34 is, for example, an imaging device capable of imaging board S, component P, and the like from above. Mark camera 34 moves in the XY direction as mounting head 32 moves so. Mark camera 34 has an imaging region residing therebelow and is configured to image a reference mark or the like which is affixed to board S for use in obtaining a position of board S and output an image so captured to control device 25.

Here, component P that mounting head 32 is to pick up will be described. Mounting head 32 not only disposes component P on an electrode on board S onto which solder has been transferred but also disposes component P having multiple electrodes E onto which solder has been transferred on board S. As shown in FIG. 2, component Pa includes circular electrodes Ea1 to Ea8, rectangular electrodes Eb1 to Eb4, and rectangular electrodes Ec1 to Ec4. Here, electrodes Ea1 to Ea8 are collectively referred to as electrodes Ea, electrodes Eb1 to Eb4 are collectively referred to as electrodes Eb, electrodes Ec1 to Ec4 are collectively referred to as electrodes Ec, electrodes Ea to Ec are collectively referred to as electrodes E, and component Pa and component Pb are collectively referred to as components P. This component Pa is disposed on board S after solder is transferred to each electrode E in transfer section 35.

Transfer section 35 is a unit for transferring solder to each of multiple electrodes E provided on component Pa. Transfer section 35 has a dish-shaped table for accommodating solder paste, a squeegee configured to move relative to the table, and a solder supply section for supplying solder paste onto the table. The squeegee is a member configured to forcibly spread solder paste on the table so as to form a film of solder paste as the squeegee moves relative to the table.

Transfer section 35 may include a movable table and a fixed squeegee or may include a fixed table and a movable squeegee. Mounting head 32 picks up component Pa and lowers that component Pa into the solder paste on the table of transfer section 35 so as for electrodes E to be brought into contact with the solder paste, whereby the solder paste is transferred onto each of electrodes E of component P.

As shown in FIG. 1, control device 25 is configured as a microprocessor made up mainly of CPU 26 and includes, for example, storage section 27 for storing various types of data. In addition to a function of controlling the whole of mounting device 13, control device 25 has a function of executing an abnormality inspection inspecting whether components P and electrodes E exist or the shapes of components P and electrodes E fall within permissible ranges, and a transfer inspection inspecting whether solder is transferred onto electrodes E appropriately. Control device 25 outputs control signals to board processing section 21, component supply section 22, part camera 23, and mounting section 30, and receives input signals from board processing section 21, component supply section 22, component camera 23, and mounting section 30. Storage section 27 stores component information 28 on component Pa, mounting condition information including a mounting order in which components P are mounted on board S, disposition positions of components P, and types of suction nozzles 33 configured to pick up components P, and the like. Component information 28 includes information on detection line L which is used as a reference in detecting electrodes E in addition to information on electrode area A denoting positions, shapes and sizes of electrodes E (refer to FIG. 4B, which will be described later). For example, control device 25 inspects whether the shapes of a main body of component Pa and electrodes E fall within the permissible ranges or whether solder is transferred onto electrodes E appropriately based on component information 28 which constitutes the reference of component Pa.

Management PC 18 is a computer configured to manage information of each device of mounting system 10. Management PC 18 includes a control section, a storage section, a display, and an input device. The control section is configured as a microprocessor which is made up mainly of CPU. The storage section stores information on the management of a production by mounting system 10, as well as mounting condition information for each mounting device 13 including a mounting order in which components P are mounted on board S, disposition positions of components P, and types of pickup members for picking up components P, and the like.

Figure 3:
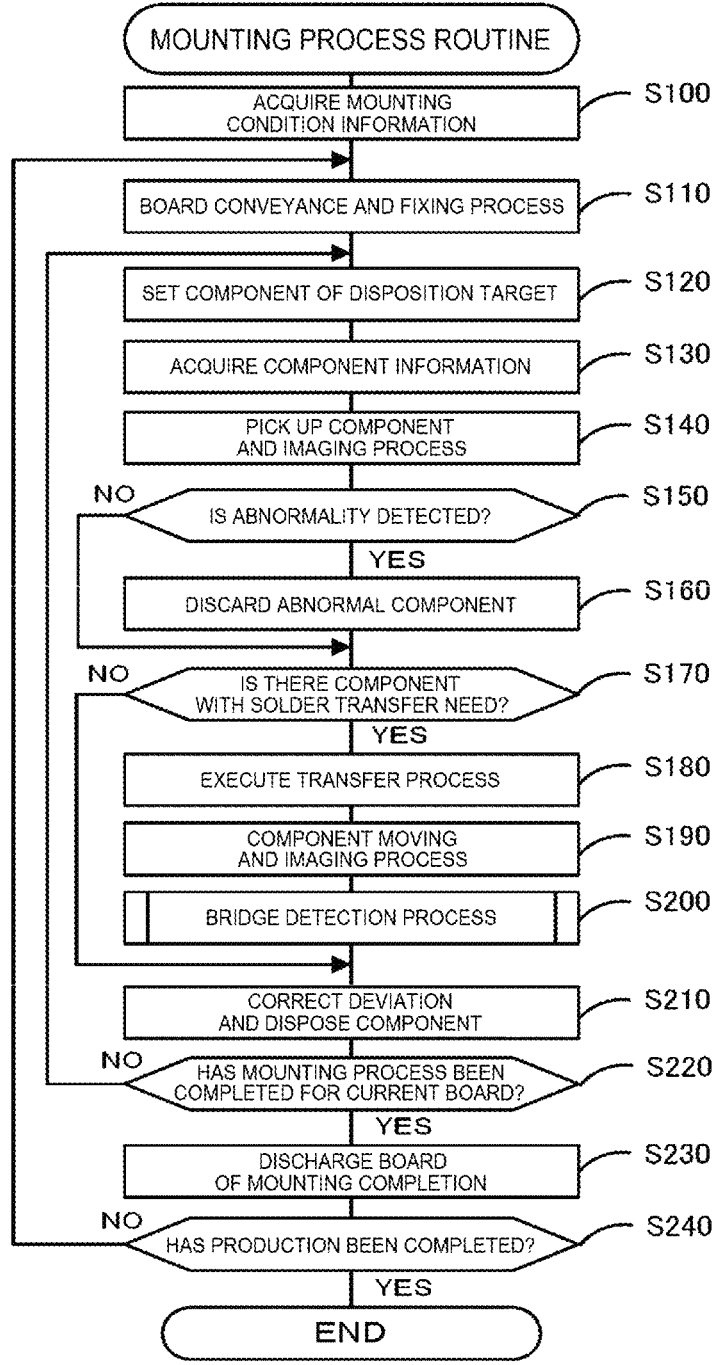
FIG. 3 is a flowchart showing an example of a mounting process routine.

Next, among operations of mounting system 10 of the present embodiment which is configured as has been described heretofore, a mounting process carried out by mounting device 13 will first be described. First, a process will be described in which mounting device 13 mounts component P on board S. FIG. 3 is a flowchart showing an example of a mounting process routine executed by CPU 26 of control device 25 of mounting device 13. This routine is stored in storage section 27 of mounting device 13 and is executed by a start instruction from an operator. When this routine is started, CPU 26 reads out to acquire the mounting condition information of board S which is to be produced this time (S100), and causes board processing section 21 not only to convey board S as far as a mounting position but also to fix it in place (S110). Subsequently, CPU 26 sets component P which is a pickup target based on the mounting condition information (S120), and reads out to acquire component information 28 corresponding to that pickup target component P (S130). Next, CPU 26 causes mounting head 32 to pick up component P from a feeder which accommodates pickup target components P and to move it to a position lying above part camera 23, and causes part camera 23 to image relevant component P which is picked up by mounting section 30 (S140).

Subsequently, CPU 26 determines whether something abnormal is detected in component P picked up by mounting head 32 (S150). This determination is made based on determinations on whether the shapes of a main body of component P and electrodes E fall within the permissible ranges, a part (for example, electrodes E, a reference mark, and the like) of component P which should originally be provided thereon exists accordingly, the position and shape of the part fall within appropriate ranges, and the like by referring to pieces of information on individual components P which are included in component information 28. When something abnormal is detected in component P, CPU 26 discards relevant component P to a predetermined discard location (S160).

Figure 4A:
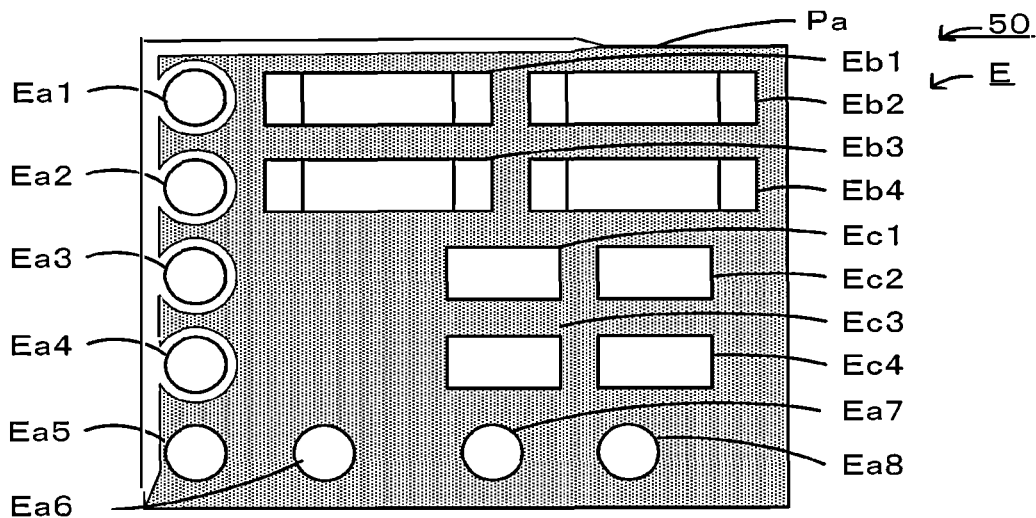
FIG. 4 shows explanatory diagrams of captured image 50 of component Pa and electrode areas A resulting from imaging that component Pa.
Figure 4B:
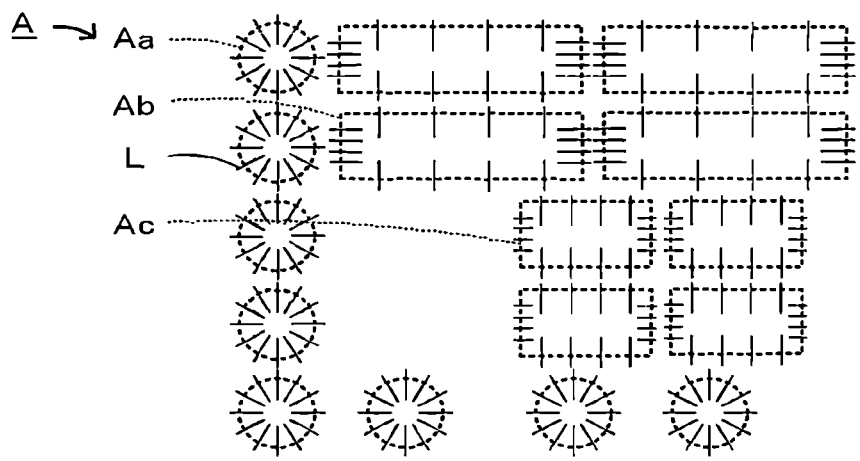
Figure 4C:
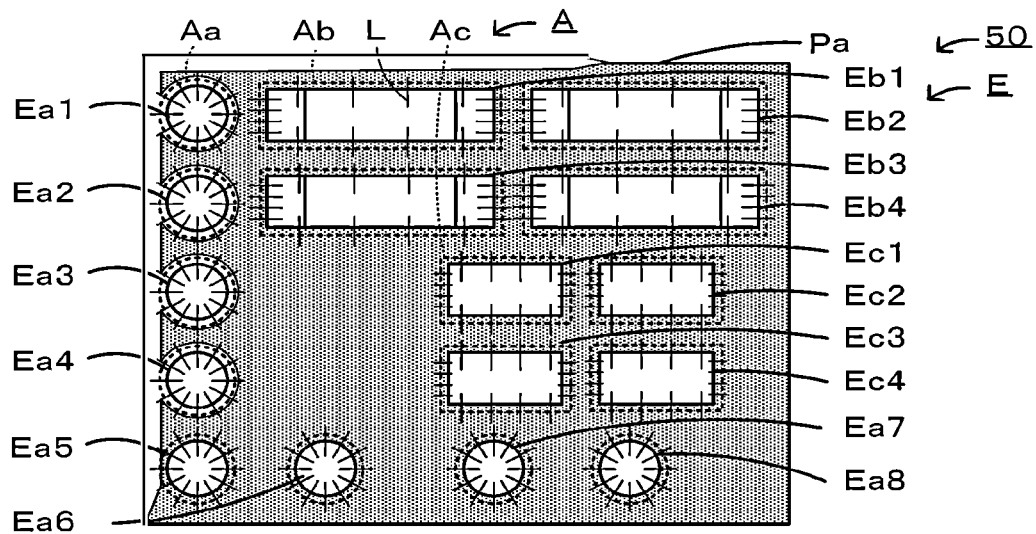
Figure 5A:
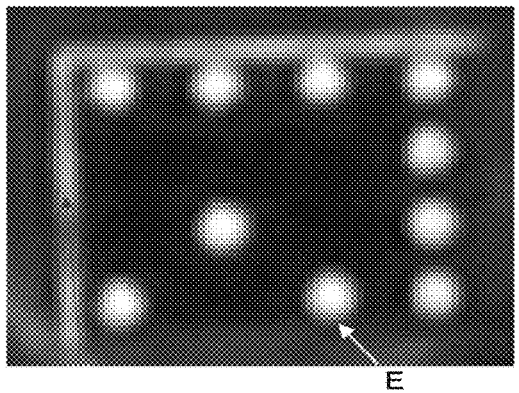
FIG. 5 shows explanatory diagrams of captured photos of an imaged component and detection lines L.
Figure 5B:
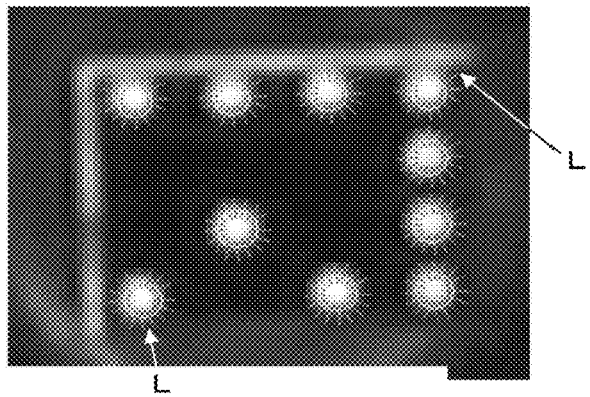

Here, abnormality detection processing will be described by taking component Pa as an example. FIG. 4 shows explanatory diagrams of captured image 50 of component Pa and electrode areas A resulting from imaging that component Pa, in which FIG. 4A is an explanatory diagram of captured image 50, FIG. 4B is an explanatory diagram of electrode areas A, and FIG. 4C is an explanatory diagram showing an application of electrode areas A to captured image 50. FIG. 5 shows explanatory diagrams of captured photos of an imaged component and detection lines L, in which FIG. 5A is an explanatory diagram of a captured photo, and FIG. 5B is an explanatory diagram showing an application of detections line L to the captured photo. With mounting device 13, electrode E is detected by use of electrode area A, which constitutes a reference, and detection lines L. In captured image 50, electrode area A is an area where electrodes E exist, and electrode area Aa is set for electrode Ea, electrode area Ab is set for electrode Eb, and electrode area Ac is set for electrode Ec. Detection line L is provided in such a manner as to cross between an inside area and an outside area of electrode area E, which is used for detecting a brightness difference therebetween, and multiple detection lines L are disposed around an outer circumference of electrode area A. Patterns of detection lines L, that is, lengths, disposition positions, numbers, and the like of detection lines L are set in advance for individual electrodes E by obtaining empirically a range where an outer edge portion of electrode E can be detected more accurately. CPU 26 can detect a point on detection line L at which a brightness value crosses a predetermined threshold as an outer edge portion (edge) of electrode E. With mounting device 13, as shown in FIGS. 4A and 5A, there may be a case in which a captured image is obtained in which electrodes E join an outer edge portion or like of a main body of component Pa due to reflected light or the like. As a result, mounting device 13 is set so that when the number of detection lines L on which an outer edge portion of electrode E is detected satisfies a predetermined tolerance ratio (for example, 60%, 70%, 80%, and the like) of a whole number of detection lines L of relevant electrode E, a position of relevant electrode E is detected based on those detection lines L where the outer edge portion of relevant electrode E is detected. In this way, with mounting device 13, a position of electrode E can be detected even though there exist detection lines L on which the outer edge portion of relevant electrode E cannot be detected due to there being no change in brightness value. CPU 26 may be configured so that CPU 26 first sets roughly positions of electrode area A and detection lines L in such a manner that a pattern of detection lines L of electrode E, which is set in advance, extends to an outer edge portion of relevant electrode E in captured image 50, and then moves those electrode area A and detection lines L to more appropriate positions. CPU 26 can grasp the existence, position, and shape of electrode E based on the brightness values on these detection lines L, and hence can detect abnormality in relevant electrode E.

After S160 or if no abnormality is detected in component P in S150, CPU 26 determines whether component Pa needing a transfer of solder is included in components P picked up by mounting section 30 (S170). If no component Pa needing a transfer of solder is included, CPU 26 corrects a deviation in angle or position of component P which is being picked up based on the captured image, and causes relevant component P to be disposed on board S (S210). Then, CPU 26 determines whether the mounting process for board S which is fixed to the mounting position has been completed (S220), and if the mounting process has not yet been completed, CPU 26 executes the operations from S120 on. That is, CPU 26 executes repeatedly the operations of setting component P to be picked up and disposed next, causing mounting section 30 to pick up component P so set, correcting the deviation of relevant component P while detecting abnormality of relevant component P, and disposing relevant component P on board S.

On the other hand, if it is determined in S220 that the mounting process for board S which is fixed to the mounting position is completed, CPU 26 causes board processing section 21 to discharge board S on which the mounting process has been completed (S230), and determines whether the production of all boards S set in the mounting condition information has been completed (S240). If the production of all boards S has not yet been completed, CPU 26 executes the operations from S110 on. That is, CPU 26 repeats the operations of conveying and fixing subsequent board S and disposing component P on relevant board S. On the other hand, if it is determined in S240 that the production of all boards S has been completed, CPU 26 ends this routine.

On the other hand, if it is determined in S170 that component Pa needing a transfer of solder is included in components P which are picked up by mounting section 30, CPU 26 transfers solder to relevant component Pa or the like (S180), moves relevant component Pa to a position above part camera 23 so as to execute an imaging process (S190), executes a bridge detection processing on the solder so transferred (S200), and executes the operations from S210 on. The bridge detection processing is processing for determining whether a bridge has occurred in which solder paste is formed over adjacent electrodes E.

Figure 6:
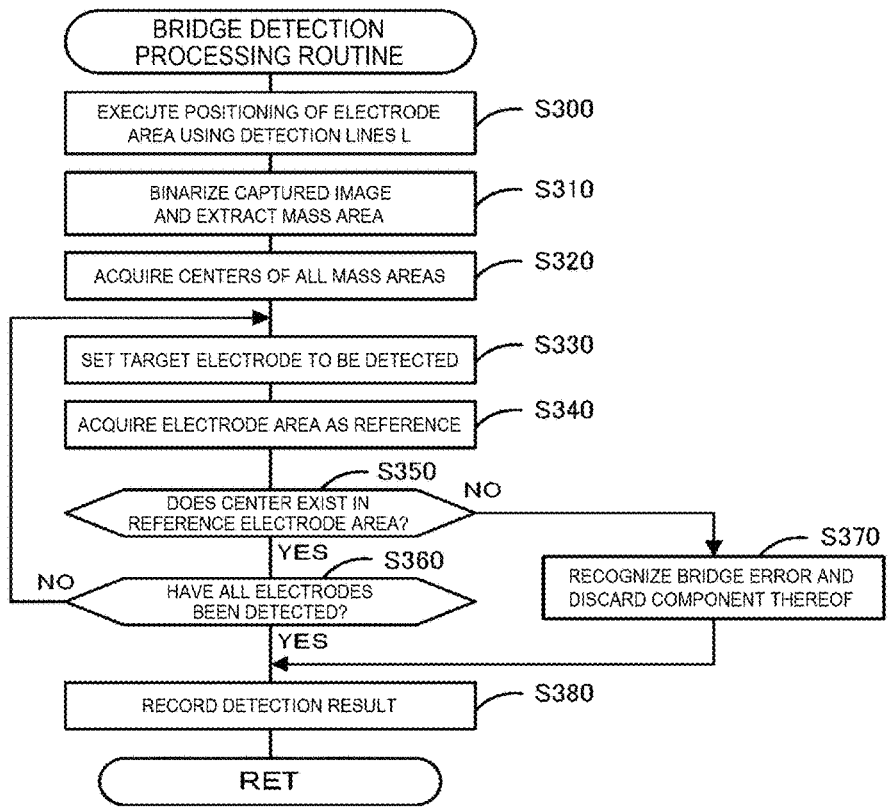
FIG. 6 is a flowchart showing an example of a bridge detection processing routine.
Figure 7A:
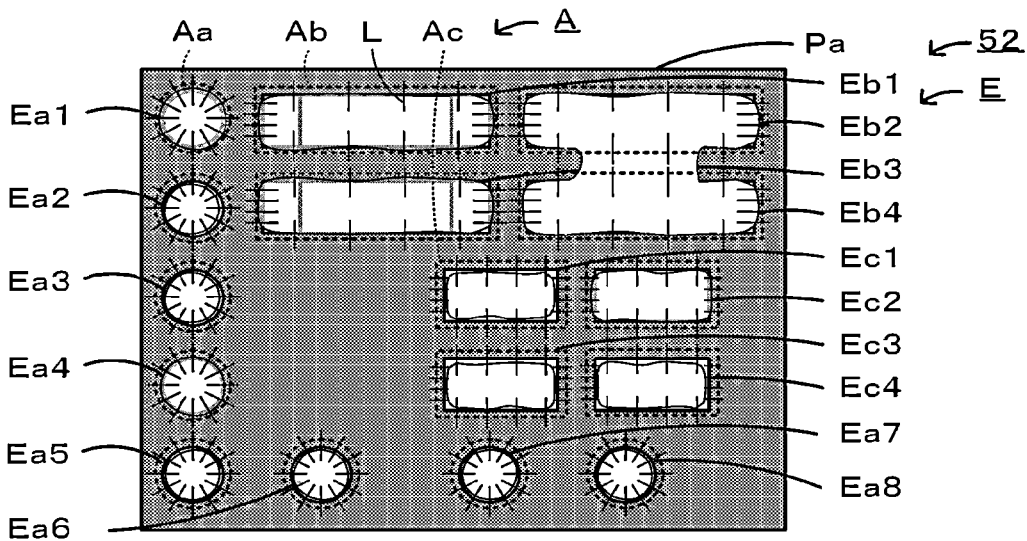
FIG. 7 shows explanatory diagrams of captured image 52 resulting from imaging component Pa onto which solder has been transferred.
Figure 7B:
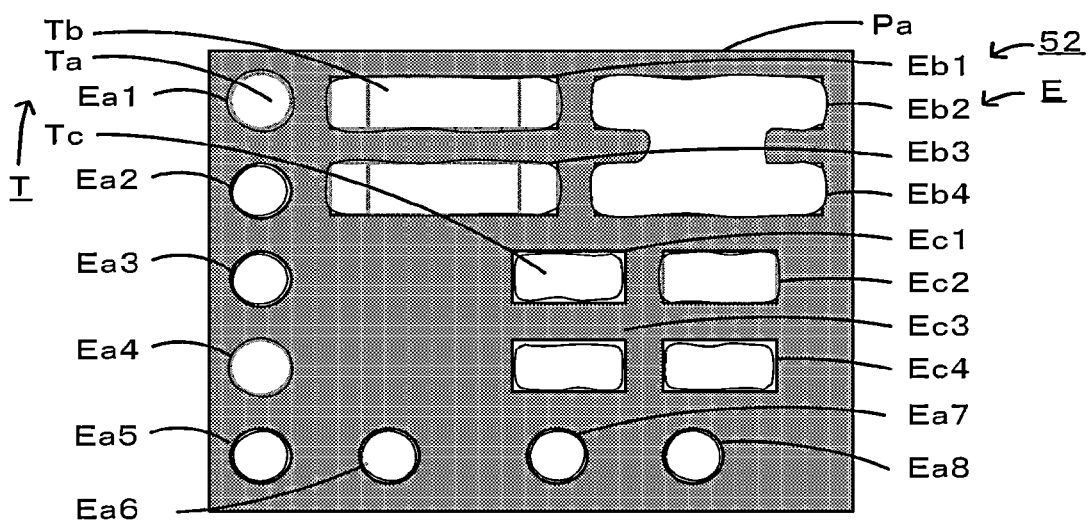
Figure 7C:
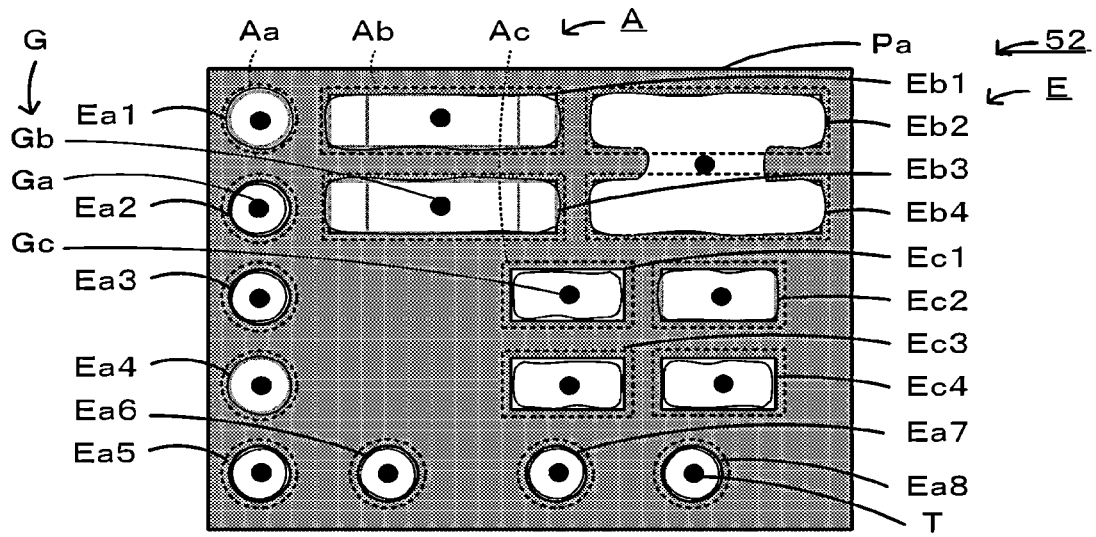
Figure 8A:
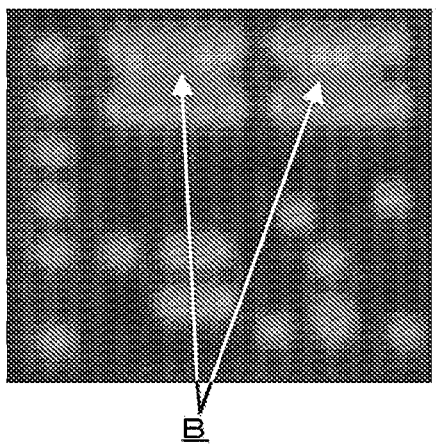
FIG. 8 shows explanatory diagrams of captured photos of an imaged component onto which solder has been transferred and detection lines L.
Figure 8B:
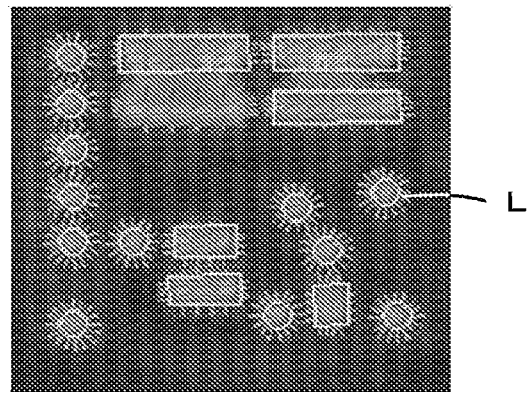
Figure 9A:
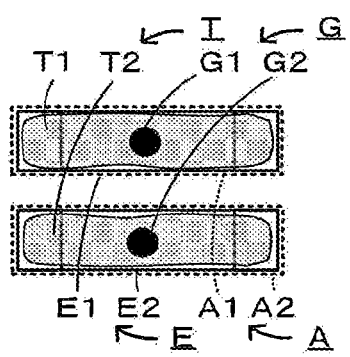
FIG. 9 shows explanatory diagrams of electrodes E, electrode areas A, mass areas T, and centers of gravity G in captured image 52.
Figure 9B:
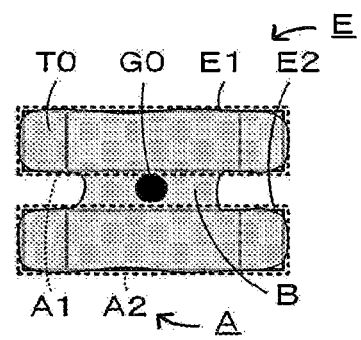
Figure 9C:
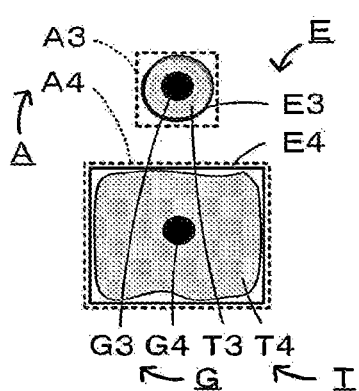
Figure 9D:
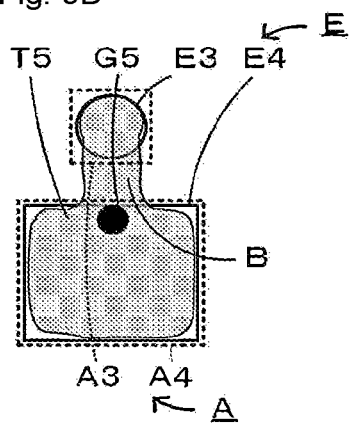

FIG. 6 is a flowchart showing an example of a bridge detection processing routine executed by CPU 26 of control device 25. FIG. 7 shows explanatory diagrams of captured image 52 resulting from imaging component Pa onto which solder has been transferred, in which FIG. 7A is a conceptual diagram in which electrode areas A and detection lines L are superposed on captured image 52, FIG. 7B is a conceptual diagram showing extracted mass areas T, and FIG. 7C is a conceptual diagram in which centers of gravity G are superposed on captured image 52. FIG. 8 shows explanatory diagrams of captured photos of an imaged component onto which solder has been transferred (FIG. 8A) and detection lines L (FIG. 8B). FIG. 9 shows explanatory diagrams of electrodes E, electrode areas A, mass areas T, and centers of gravity G in captured image 52, in which FIGS. 9A and 9C are explanatory diagrams of captured images 52 having no bridge, and FIGS. 9B and 9D are explanatory diagrams of captured images 52 having a bridge. In FIGS. 7, 9, solder areas on electrodes Ea are collectively referred to as mass areas Ta, solder areas on electrodes Eb are collectively referred to as mass areas Tb, solder areas on electrodes Ec are collectively referred to as mass areas Tc, and mass areas Ta to Tc are collectively referred to as mass areas T. Similarly, centers of gravity of mass areas Ta are collectively referred to as centers of gravity Ga, centers of gravity of mass areas Tb are collectively referred to as centers of gravity Gb, centers of gravity of mass areas Tc are collectively referred to as centers of gravity Gc, and centers of gravity Ga to Gc are collectively referred to as centers of gravity G.

When CPU 26 starts a bridge detection processing routine, CPU 26 superposes electrode areas A including detection lines L on captured image 52 and positions relevant electrode areas A (S300). Here, even in the case that an image is obtained which shows a state in which electrodes E join an outer edge portion of a main body of component Pa as shown in FIG. 4, as shown in FIG. 7A, CPU 26 can detect electrodes E by use of the tolerance ratio of detection lines L as with S150, thereby making it possible to position electrode areas A on areas where electrodes E exist. Subsequently, CPU 26 binarizes captured image 52 resulting after a solder transfer process has been executed, and extracts a mass of electrode areas having substantially the same brightness values as mass area T (S310). In this processing, a binarization threshold for extracting an area to which solder has been transferred is empirically set, and CPU 26 detects an outer edge portion of the area to thereby extract an area inside the outer edge portion as mass area T to which solder has been transferred. As shown in FIG. 7B, CPU 26 extracts mainly an area to which solder has been transferred in captured image 52 as mass area T.

Next, CPU 26 obtains centers of gravity G of all mass areas T which are so extracted (S320). CPU 26 obtains a center of gravity G from a range of mass area T without considering a distribution of brightness values within relevant mass area T. Subsequently, CPU 26 sets any one of electrodes E as a detection target (S330), and acquires a position and a size of electrode area A as a reference of relevant electrode E so set from component information 28 (S 340). Subsequently, CPU 26 determines whether center of gravity G of mass area T is included in that electrode area A which acts as the reference of relevant electrode E (S350). If it is determined that relevant center of gravity G is included in that electrode area A, CPU 26 determines whether the detection in S350 has been executed on all electrodes E (S360), and if it is determined that the detection in S350 has not yet been executed on all electrodes E, CPU 26 executes the operations from S330 on. That is, CPU 26 sets electrode E for a subsequent inspection target and determines whether center of gravity G of mass area T is included in electrode area A serving as the reference of relevant electrode E.

On the other hand, if it determines in S350 that relevant reference electrode area A does not include center of gravity G of mass area T, then determining that a bridge has occurred in which solder paste is formed over multiple electrodes E, CPU 26 executes a discard process of discarding component Pa which is constituting the current detection target (S370). For example, as shown in FIGS. 9A, 9C, in the case that no bridge has occurred, one electrode area A includes one center of gravity of mass area T. On the other hand, as shown in FIGS. 9B, 9D, when a bridge has occurred between electrodes E, there has occurred electrode area A including no center of gravity G. CPU 26 detects an occurrence of a bridge by making use of a relationship between center of gravity G of mass area T and electrode area A. It is also conceivable that CPU 26 determines an occurrence of a bridge based on whether the number of centers of gravity G of mass areas T coincides with the number of electrode areas A, but since there may be a case in which mass area T is detected based on other factors than electrode area A, for example, a reference mark, with this method, there is a possibility of an occurrence of an erroneous detection. With this control device 25, an occurrence of a bridge in solder transfer can be detected in an ensured fashion based on whether center of gravity G is included in electrode area A.

Then, after S370 or after the detection in S350 has been executed on all electrodes E in S360, CPU 26 records the results of the detections in storage section 27 (S380), and ends this routine.

Here, correspondences between the constituent elements of the present embodiment and constituent elements of the present disclosure will be clarified. Control device 25 of the present embodiment corresponds to an inspection device of the present disclosure, CPU 26 corresponds to a control section. In addition, any one of electrodes Ea to Ec corresponds to a predetermined part, solder paste corresponds to a viscous fluid, component Pa corresponds to a processing target object, mass area T corresponds to a mass area, center of gravity G corresponds to a center, electrode area A corresponds to a normal range, and detection line L corresponds to a detection line. In the present embodiment, an example of an inspection method of the present disclosure is also clarified by describing the operations of control device 25.

With control device 25 (the inspection device) of the present embodiment that has been described heretofore, mass area T is extracted which is included in a captured image resulting from imaging component Pa as a processing target object where solder as a viscous fluid is formed on electrode E as a predetermined part, center of gravity G of mass area T so extracted is obtained, and whether center of gravity G of mass area T is included in electrode area A (a normal range of the predetermined part) which constitutes the reference of the captured image is determined, whereby whether a bridge has occurred is determined. In detecting an area where solder is formed, for example, in the case that a bridge has occurred over multiple electrodes E, multiple areas join together to be extracted as a mass area, as a result of which electrode area A including no center of gravity G has occurred. With this control device 25, a bridge can be detected more appropriately by determining on the existence of electrode area A which includes no center of gravity G.

In control device 25, the processing target object is component Pa having two or more electrodes E and needing a transfer of solder, the viscous fluid is solder, the predetermined part is electrode E, and CPU 26 determines whether a bridge of solder has occurred. With this control device 25, a bridge of solder can be detected more appropriately for component Pa having two or more electrodes E. Further, CPU 26 specifies a position of electrode E in the captured image based on detection lines L which satisfy the predetermined tolerance ratio by use of multiple detection lines L, crossing between an inside area of electrode E and an outside area of electrode E, for detecting a brightness difference therebetween, and detects a state of disposition of component Pa, whereby CPU 26 determines whether a bridge has occurred. With this control device 25, even in the case that an image is captured in which electrode E formally joins another part, a position of electrode E can flexibly be detected by use of detection lines L and the tolerance ratio, whereby for example, component Pa can be positioned based on the position of electrode E so detected. Then, with this control device 25, a bridge can be detected more appropriately after the position of electrode E is grasped.

The inspection device and the inspection method which are disclosed in the present description are not limited in any way by the embodiment that has been described heretofore, and hence, needless to say, the inspection device and the inspection method can be carried out in various manners without departing from the technical scope of the present disclosure.

For example, in the embodiment described above, the processing target object is described as being component Pa having two or more electrodes E, however, the processing target object is not particularly limited thereto as long as the processing target object is such that a bridge has occurred in which a viscous fluid is formed over adjacent predetermined parts, and hence, for example, board S having multiple electrodes E, a three dimensionally-shaped base material, and the like are raised as examples of the processing target object. In addition, in the embodiment described above, the viscous fluid is described as being solder, however, the viscous fluid is not particularly limited thereto as long as the viscous fluid is such as to be formed at the predetermined part, and hence, for example, a conductive material paste, an adhesive, a resin such as an insulating material, and the like are raised as examples of the viscous fluid. Similarly, in the embodiment described above, control device 25 is described as determining on a bridge of solder, however, the present description is not particularly limited thereto, and hence, control device 25 may be configured so as to detect a bridge in which an adhesive is formed at multiple adhesion parts. In particular, the inspection device may be configured such that the processing target object is board S having two or more electrodes, the viscous fluid is solder, and CPU 26 determines whether a bridge of solder has occurred. With this inspection device, a bridge of solder can be detected more appropriately in board S having two or more electrodes. The processing target object is preferably a component for an easy detection of solder from the viewpoint of color difference.

In the embodiment described above, CPU 26 is described as specifying a position of electrode E based on detection lines L which satisfy the tolerance ratio to detect a state of disposition of component Pa, however, the present description is not particularly limited thereto, and hence, this processing may be omitted, or a state of disposition of component Pa may be detected by use of other methods than this processing. The inspection device is preferably configured so as to specify a position of a predetermined part based on detection lines L which satisfy the tolerance ratio, because the detection device can detect flexibly a position of a predetermined part by use of the detection lines even in the case that a predetermined part is detected as formally joining another part.

In the embodiment described above, the inspection device of the present disclosure is described as control device 25 or mounting device 13, however, the present disclosure is not particularly limited thereto, and hence, the inspection method of the present disclosure may be described as the operations of control device 25 or mounting device 13. In the embodiment described above, mounting device 13 is described as including control device 25 which doubles as the inspection device, however, the present description is not particularly limited thereto, and hence, any one of the mounting related devices of mounting system 10 which are involved in the mounting process of mounting component P on board S may be configured so as to double as the inspection device of the present disclosure. For example, in the case that the processing target object is board S and printing device 11 detects a bridge of solder printed on board S, print inspection device 12 may double as the inspection device described above. For this configuration, board information similar to component information 28 only need be stored in storage section 44, and CPU 43 of control device 42 only need control inspection section 45 to thereby execute the bridge detection processing routine.

Here, the inspection device and the inspection method of the present disclosure may be configured as follows. For example, the inspection device of the present disclosure may be configured such that the processing target object is a component having two or more electrodes, the viscous fluid is solder, and the control section determines whether a bridge of the solder has occurred. With this inspection device, a bridge of solder can be detected more appropriately for a component having two or more electrodes. Alternatively, the inspection device may be configured such that the processing target object is a board having two or more electrodes, the viscous fluid is solder, and the control section determines whether a bridge of the solder has occurred. With this inspection device, a bridge of solder can be detected more appropriately for the board having two or more electrodes. The processing target object is preferably a component for an easy detection of solder from the viewpoint of color difference.

The inspection device of the present disclosure may be configured such that the control section uses multiple detection lines, crossing between an inside area of the predetermined part and an outside area of the predetermined part, for detecting a brightness difference therebetween to specifies a position of the predetermined part based on the detection lines which satisfy a predetermined tolerance ratio, and then detects a state of disposition of the processing target object to thereafter detect whether the bridge has occurred. With this inspection device, even in the case that the predetermined part formally joins another part, the position of the predetermined part can flexibly be detected by use of the detection lines, thereby making it possible to position the processing target object based on the position of the predetermined part. Then, with this inspection device, by grasping the position of the predetermined part, the bridge can be detected much more appropriately.

The inspection method of the present disclosure constitutes an inspection method for use in a mounting system including a mounting device for disposing a component on a board, including:
(a) extracting a mass area included in a captured image resulting from imaging a processing target object where a viscous fluid is formed at a predetermined part; and
(b) obtaining a center of gravity of the mass area so extracted in (a), and determining whether the center of gravity is included in a normal range of the predetermined part as a reference of the captured image to thereby determine whether a bridge has occurred where the viscous fluid is formed over adjacent predetermined parts.

With this inspection method, as with the inspection device described above, a bridge can be detected more appropriately by determining on a predetermined part including no center of gravity. In this inspection method, various manners of the inspection device described above may be adopted, or steps of realizing the individual functions of the detection device may be added.

INDUSTRIAL APPLICABILITY

The inspection device and the inspection method of the present disclosure can be applied to a technical field of devices for picking up and disposing components.

REFERENCE SIGNS LIST

10 mounting system, 11 printing device, 12 print inspection device, 13 mounting device, 14 mounting inspection device, 18 management PC, 21 board processing section, 22 component supply section, 23 part camera, 25 control device, 26 CPU, 27 storage section, 28, 28B component information, 30 mounting section, 31 head moving section, 32 mounting head, 33 suction nozzle, 34 mark camera, 35 transfer section, 41 board processing section, 42 control device, 43 CPU, 44 storage section, 45 inspection section, 46 head moving section, 47 inspection head, 48 imaging section, 50, 52 captured image, A, Ab2, Ac electrode area, E, Ea1 to Ea8, Eb1 to Eb4, Ec1 to Ec4 electrode, P, Pa component, S substrate

The invention claimed is:

1. An inspection device for use in a mounting system including a mounting device for disposing a processing target object on a board, comprising:
   a processor; and
   a memory storing instructions executable by the processor,
   wherein the processor is configured to:
      capture an image by imaging the processing target object;
      extract a mass area included in the captured image of the processing target object where a viscous fluid is formed at a predetermined part;
      obtain a location of a center of gravity of the mass area;
      determine whether the location of the center of gravity is within boundaries of an area of the predetermined part relative to a reference image of the predetermined part with the viscous fluid present;
      detect a brightness difference between a plurality of detection lines crossing between an inside area of the predetermined part and an outside area of the predetermined part;
      detect a state of disposition of the processing target object based on detection lines of the plurality of detection lines that satisfy a predetermined tolerance ratio;
      determine, based on the location of the center of gravity and the state of disposition of the processing target object, whether a bridge has occurred, wherein the bridge is a formation of the viscous fluid over adjacent predetermined parts; and
      execute a discard process of discarding the processing target object in response to determining that the bridge has occurred.

2. The inspection device according to claim 1,
   wherein the processing target object is a component having two or more electrodes,
   wherein the viscous fluid is solder, and
   wherein the processor is further configured to determine whether a bridge of the solder has occurred.

3. An inspection method for use in a mounting system including a mounting device for disposing a processing target object on a board, comprising:
   capturing an image by imaging the processing target object;

extracting a mass area included in the captured image of the processing target object where a viscous fluid is formed at a predetermined part;
obtaining a location of a center of gravity of the mass area;
determining whether the location of the center of gravity is within boundaries of an area of the predetermined part relative to a reference image of the predetermined part with the viscous fluid present;
  detecting a brightness difference between a plurality of detection lines crossing between an inside area of the predetermined part and an outside area of the predetermined part;
  detecting a state of disposition of the processing target object based on detection lines of the plurality of detection lines that satisfy a predetermined tolerance ratio;
determining, based on the location of the center of gravity and the state of disposition of the processing target object, whether a bridge has occurred, wherein the bridge is a formation of the viscous fluid over adjacent predetermined parts; and
executing a discard process of discarding the processing target object in response to determining that the bridge has occurred.

* * * * *